US007068352B2

(12) United States Patent
Irie

(10) Patent No.: US 7,068,352 B2
(45) Date of Patent: Jun. 27, 2006

(54) EXPOSURE APPARATUS

(75) Inventor: Naoki Irie, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 114 days.

(21) Appl. No.: 10/785,803

(22) Filed: Feb. 23, 2004

(65) Prior Publication Data

US 2004/0233401 A1    Nov. 25, 2004

(30) Foreign Application Priority Data

Feb. 24, 2003  (JP) .............................. 2003-046530

(51) Int. Cl.
*G03B 27/42*  (2006.01)
*G03B 27/52*  (2006.01)
*G03B 27/54*  (2006.01)

(52) U.S. Cl. .............................. 355/53; 355/30; 355/67
(58) Field of Classification Search .................. 355/30, 355/53, 67

See application file for complete search history.

(56) References Cited

U.S. PATENT DOCUMENTS

| | | | |
|---|---|---|---|
| 5,559,584 A * | 9/1996 | Miyaji et al. .................. 355/73 |
| 6,341,006 B1 | 1/2002 | Murayama et al. |
| 6,542,220 B1 * | 4/2003 | Schrijver et al. .............. 355/53 |
| 6,559,922 B1 * | 5/2003 | Hansell et al. ................. 355/30 |
| 6,642,996 B1 * | 11/2003 | Nogawa ....................... 355/72 |
| 6,665,046 B1 * | 12/2003 | Nogawa et al. ............... 355/30 |
| 6,721,031 B1 * | 4/2004 | Hasegawa et al. ............. 355/30 |
| 2002/0000519 A1 * | 1/2002 | Tsukamoto ............... 250/492.1 |
| 2002/0191166 A1 * | 12/2002 | Hasegawa et al. ............. 355/53 |

FOREIGN PATENT DOCUMENTS

| | | |
|---|---|---|
| JP | 4-365050 | 12/1992 |
| JP | 8-279458 | 10/1996 |
| JP | 2001-118783 | 4/2001 |

* cited by examiner

*Primary Examiner*—Rodney Fuller
(74) *Attorney, Agent, or Firm*—Morgan & Finnegan, LLP

(57) ABSTRACT

An exposure apparatus for scanning and exposing an object includes a surrounding member for surrounding a space around the object, and a gas supplier for supplying a gas to the space in two directions which are substantially parallel to a scanning direction.

11 Claims, 9 Drawing Sheets

EXPOSURE APPARATUS

This application claims the right of priority under 35 U.S.C. §119 based on Japanese Patent Application No. 2003-046530 filed on Feb. 24, 2003, which is hereby incorporated by reference herein in its entirety as if fully set forth herein.

BACKGROUND OF THE INVENTION

The present invention relates generally to exposure apparatuses, and more particularly to an exposure apparatus that is used to expose objects, such as a single crystal plate for a semiconductor wafer, a glass plate for a liquid crystal display ("LCD"). The present invention is suitable, for example, for an exposure apparatus that uses light having a wavelength of 200 nm or smaller as an exposure light source.

A projection exposure apparatus that transfers a circuit pattern on a reticle or a mask onto a wafer and the like has conventionally been used to fabricate fine semiconductor devices, such as a semiconductor memory and a logic circuit, with photolithography technology.

The resolution (or critical dimension to be transferred) of the projection exposure apparatus is proportional to a wavelength of the exposure light and inversely proportional to its numerical aperture ("NA"). Therefore, the shorter the wavelength is, the better the resolution is. Recent demands for fine processing to the semiconductor devices have promoted use of shorter wavelengths of the exposure light. In recent years, an exposure light source has been in transition from the conventional ultrahigh pressure mercury lamp (g-line (with a wavelength of approximately 436 nm), i-line (with a wavelength of approximately 365 nm)) to KrF excimer laser (with a wavelength of approximately 248 nm) and ArF excimer laser (with a wavelength of approximately 193 nm), which have shorter wavelengths. $F_2$ laser (with a wavelength of approximately 157 nm) has been being reduced to practice.

The exposure light with a wavelength under 200 nm has an emission spectrum that overlaps an absorption band of oxygen, is subject to absorptions by oxygen, and results in reduced exposure light quantity or transmittance on the object and lowered throughput of the apparatus. In addition, ozone created from oxygen that has absorbed the exposure light absorbs more exposure light, and various ozone-induced products adhere onto optical elements' surfaces, lowering the optical performance of an optical system. In particular, a spectrum band of $F_2$ laser also overlaps an absorption band of water. Therefore, water as well as oxygen absorb the exposure light, and lower its transmittance, the throughput of an apparatus, and the optical performance of an optical system.

A projection optical apparatus that uses as a light source ArF laser or $F_2$ laser or the like thus needs to purge oxygen and water from an exposure light's optical path by supplying photochemically non-reactive, inert gas (such as nitrogen gas, helium gas and argon gas) to an atmosphere of the optical path of an illumination optical system and a projection optical system. For example, an exposure apparatus has been proposed which maintains a projection optical system in an enclosed space from its side end close to a photosensitive substrate to its end close to the photosensitive substrate, and purges the enclosed space and the projection and illumination optical systems with inert gas (see, for example, Japanese Patent Application Publication No. 8-279458).

Deposits caused by impurities included in the surrounding atmosphere, such as ammonium sulfide and silicon oxide, adhere onto the surfaces of optical elements in an exposure apparatus. These deposits contaminate the optical elements, and deteriorate the optical performance, such as the lowered or uneven light intensity. One impurity source is gas emissions from resist on a photosensitive substrate. In particular, an optical element in the projection optical system located closest to the photosensitive substrate always suffers from gas from the resist, and remarkably lowers its optical performance.

There has been proposed an exposure apparatus that detachably arranges a parallel plate as an optical element in an optical path between a projection optical system and a photosensitive substrate, and replaces the optical element with a new one when it is contaminated (see, for example, Japanese Patent Application Publication No. 4-365050).

There has also been proposed an exposure apparatus that prevents oxygen and water existing, etc. in an optical path from absorbing the exposure light, and deposits from contaminating an optical element (see, for example, Japanese Patent Application Publication No. 2001-118783). This exposure apparatus will be explained with reference to FIG. 11, which is a schematic structure of a part of a conventional exposure apparatus 1000.

Referring to FIG. 11, a projection optical system 1100 projects a pattern image of the reticle (not shown) under exposure light EL in a vacuum UV region onto a wafer 1200 on a wafer-stage 1250 in a wafer chamber 1300. A blower plate 1400 has an opening 1410 that opens an optical path of the exposure light EL, and is placed between the projection optical system 1100 and the wafer 1200. The blower plate 1400 supplies inert gas from an inlet 1430 to a first space H1 in one direction and effectively exhausts gas from the wafer 1200, after exhausting the atmosphere in the first space H1 from an outlet 1420. The blower plate 1400 also supplies inert gas into a second space H2 at a lower position.

Disadvantageously, the exposure apparatus in Japanese Patent Application Publication No. 8-279458 has a thin air layer between the photosensitive substrate and the neighborhood of the photosensitive substrate and cannot completely purge with inert gas the space between them, causing the exposure light to be absorbed by oxygen, the water or the like. Especially, $F_2$ laser as exposure light is greatly absorbed even in a thin air layer, and its decreased light quantity reaching the object greatly lowers the throughput of the apparatus.

On the other hand, the exposure apparatus in Japanese Patent Application Publication No. 4-365050 cannot prevent contaminations of the parallel plate as an optical element, disadvantageously causing increased running cost due to frequent exchanges of the optical element. Especially, a glass material applicable to a wavelength of $F_2$ laser or the like is limited to calcium fluoride ($CaF_2$), and increases the processing cost as well as the material cost due to higher surface precision of the optical element for the higher resolution. Therefore, the exposure apparatus is not viable unless the parallel plate as an optical element is free of contaminations.

The exposure apparatus published in Japanese Patent Application Publication No. 2001-118783 arranges the inlet 1430 and the outlet 1420 in the first space H1 (between the projection optical system 1100 and the blower plate 1400), and flows gas in one direction. However, the outlet 1420 located in the first space H1 easily takes oxygen or water outside into the first space H1, and disadvantageously lowers the purge efficiency. A proposed configuration that eliminates the blower plate 1400 and the outlet 1420 from a downstream of an exposure area is not also viable, because it takes surrounding gas and remarkably lowers the gas blowing efficiency at the opening 1410.

BRIEF SUMMARY OF THE INVENTION

Accordingly, it is an exemplary object to provide an exposure apparatus with excellent throughput and optical performance, which reduces absorptions of exposure light, maintains the exposure light quantity on the object, and prevents contaminations of an optical element.

An exposure apparatus of one aspect according to the present invention for scanning and exposing an object includes a surrounding member for surrounding a space around the object, and a gas supplier for supplying gas to the space in two directions which are substantially parallel to a scanning direction.

The exposure apparatus may further include a scanning portion for scanning a pattern in synchronization with the object, and a projection optical system for projecting the pattern onto the object, wherein the surrounding member surrounds a space between the projection optical system and the object.

An exposure apparatus for exposing a pattern on a reticle onto an object by scanning the reticle and the object includes a projection optical system for projecting the pattern onto the object, a surrounding member, provided between the projection optical system and the object and spaced from the object, for keeping airtight a space around the object in cooperation with the projection optical system, and a gas supplier for supplying gas to the space in two directions parallel to a scanning direction.

The surrounding member may be detachably connected to the projection optical system. The projection optical system may include a parallel plate that contacts the space around the object. The exposure apparatus may further include a seal for maintaining airtight the projection optical system and the surrounding member.

The exposure apparatus may further include a position detector for detecting a position of the object by obliquely irradiating light onto the object, and a transmission element, provided to the surrounding member, for transmitting light for position detections and for maintaining airtight the space. The gas supplier may supply the gas to the space in two opposite directions parallel to the scanning direction. The gas supplied in the scanning direction of the object is more than the gas supplied in a direction opposite to the scanning direction. The exposure apparatus may further include a gas flow controller for controlling a flow of the gas supplied in the scanning direction of the object and/or a direction opposite to the scanning direction in accordance with the scanning direction and/or a scanning speed of the object. The gas supplied by the gas supplier may be inert gas.

A method of another aspect according to the present invention for exposing a pattern on a reticle onto an object by scanning the reticle and the object relative to a projection optical system includes the steps of maintaining airtight a space between the projection optical system and the object, and purging the space in two directions parallel to a scanning direction.

A device fabrication method of still another aspect according to the present invention includes the steps of exposing an object by the above exposure apparatus, and developing the object that has been exposed.

Other objects and further features of the present invention will become readily apparent from the following description of the preferred embodiments with reference to accompanying drawings.

BRIEF DESCRIPTION OF THE DRAWINGS

FIG. 1 is a schematic structure of an exposure apparatus of one aspect according to the present invention, wherein

FIG. 4 is a schematic structure of a variation of the exposure apparatus shown in FIG. 1, wherein

DETAILED DESCRIPTION OF THE PREFERRED EMBODIMENTS

Figure 1A:
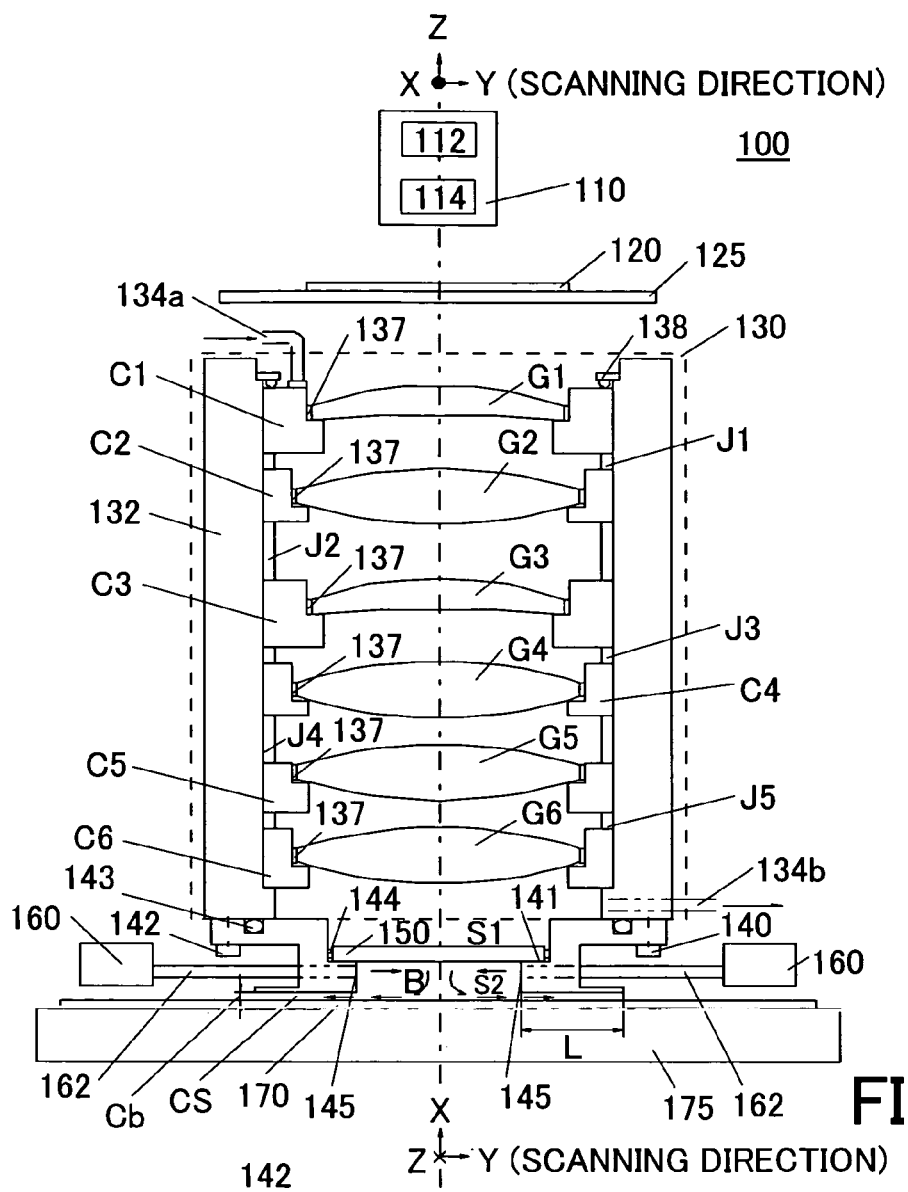
FIG. 1A is a front sectional view.
Figure 1B:
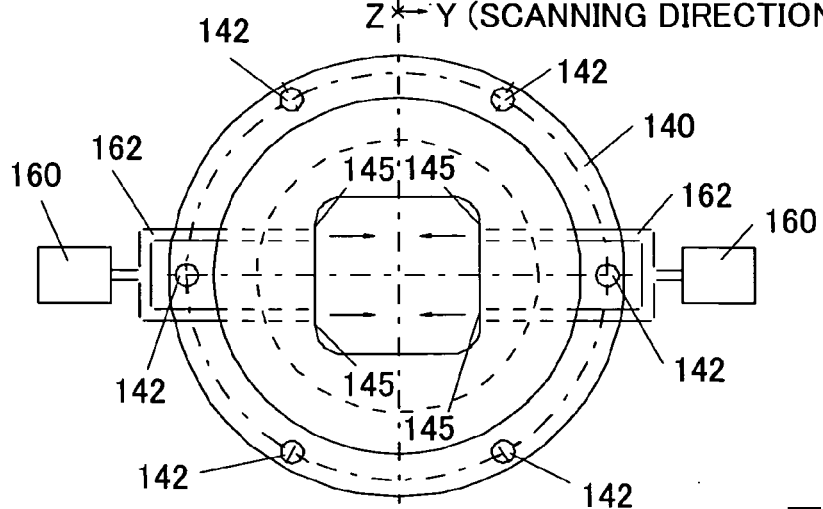
FIG. 1B is a bottom sectional view.

Referring now to the accompanying drawings, a description will be now given of an exposure apparatus according to one aspect of the present invention. The same element in each figure is designated by the same reference numeral, and a description thereof will be omitted. Here, FIG. 1 is a schematic structure of the exposure apparatus 100, wherein FIGS. 1A and 1B are front and bottom sectional views, respectively. A gravity direction is −Z direction and a scanning direction is ±Y direction in FIG. 1.

The exposure apparatus 100 includes, as shown in FIG. 1, an illumination unit 110 that illuminate a reticle 120 on which a circuit pattern is formed, a projection optical system 130 that projects diffraction light from a illuminated reticle pattern, a surrounding member 140, an optical element 150, a gas supplier 160, and a plate stage 175 that supports a plate 170.

The exposure apparatus 100 is a scanning exposure apparatus (or also called a "scanner"), which exposes a circuit pattern formed on the reticle 120 onto the plate 170 by a step-and-scan manner. This exposure apparatus is suitable for a photolithography process of a sub-micron or a quarter-micron or less. The "step-and-scan manner", as used herein, is an exposure method that exposes a reticle pattern onto a wafer by continuously scanning the wafer relative to the reticle, and by moving, after a shot of exposure, the wafer stepwise to the next exposure area to be shot.

The illumination unit 110 illuminates the reticle 120 on which the circuit pattern to be transferred is formed, and includes a light source section 112 and an illumination optical system 114.

The light source section 112 may use, for example, a laser as a light source. The laser may be an ArF excimer laser with a wavelength of approximately 193 nm, a KrF excimer laser with a wavelength of 248, an $F_2$ excimer laser with a wavelength of 157 nm, etc. However, a kind of laser is not limited to the excimer laser. For example, a YAG laser can be used, and the number of light sources is not limited. For example, if two units of solid laser that operate independently are used, no coherence between these solid laser units exists, and thus speckles arising from the coherence will be reduced considerably. In addition, an optical system may swing in a straight or rotary manner for speckle reduction purposes. The light source section 112 that uses a laser preferably employs a beam shaping optical system that shapes a parallel beam from a laser source to a desired beam shape, and an incoherent production optical system that turns a coherent laser beam to an incoherent one. A light source applicable to the light source section 112 is not limited to a laser, and may use one or more lamps such as a mercury lamp and a xenon lamp, etc.

The illumination optical system 114 is an optical system that illuminates the reticle 120, and includes a lens, a mirror, an optical integrator, a stop, and the like, for example, in order of a condenser lens, a fly-eye lens, an aperture stop, a condenser lens, a slit, and an imaging optical system. The illumination optical system 114 may use any light whether it is axial or non-axial. The optical integrator may include a fly-eye lens or an integrator formed by stacking two sets of cylindrical lens array plates (or lenticular lenses), or may be an optical rod or a diffractive element.

The reticle 120 forms a circuit pattern or an image to be transferred, and is made, for example, of quartz. It is supported and driven by a reticle stage 125. The projection optical system 130 projects diffracted light from the reticle 120 onto the plate 170. The reticle 120 and the plate 170 are arranged conjugate with each other. Since the exposure apparatus 100 is a scanner, it transfers a pattern on the reticle 120 onto the plate 170 by scanning the reticle 120 and the plate 170 at a velocity ratio corresponding to a reduction magnificent ratio.

The reticle stage 125 supports the reticle 120, and is connected to a transport mechanism (not shown). Any structure known in the art can be applied to the reticle stage 125. The transport mechanism (not shown) is made up of a linear motor etc., and drives the reticle stage 125 at least in the ±Y direction, thus moving the reticle 120. The exposure apparatus 100 synchronously scans the reticle 120 and the plate 170.

The projection optical system 130 projects a reduced size of a circuit pattern formed on the reticle 120 onto the plate 170. The projection optical system 130 may use an optical system consisting of a plurality of lens elements, an optical system comprised of a plurality of lens elements and at least one concave mirror (a catadioptric optical system), an optical system comprised of a plurality of lens elements and at least one diffractive optical element such as a kinoform, or a full mirror type optical system, and so on. Necessary corrections to the chromatic aberration may use a plurality of lens units made from glass materials having different dispersion values (Abbe values), or arrange a diffractive optical element such that it disperses in a direction opposite to that of the lens unit.

The projection optical system 130 includes optical elements G1–G6, cell members C1–C6, lens barrel 132, and purging unit 134 in this embodiment.

The optical elements G1–G6 are loaded on the cell members C1–C6, which are explained later, and image light through diffractions reflections and diffractions. The optical elements G1–G6 are adhered to the cell members C1–C6 around their circumferences by bonding members 137, and held securely by the cell members C1–C6. Leaf springs or holding rings (not shown) can be used to hold the optical elements G1–G6.

The cell members C1–C6 have an annular shape around an optical axis. They are held by a spacer J1 for adjusting the space between the optical element G1 and the optical element G2, a spacer J2 for adjusting the space between the optical element G2 and the optical element G3, a spacer J3 for adjusting the space between the optical element G3 and the optical element G4, a spacer J4 for adjusting the space between the optical element G4 and the optical element G5, a spacer J5 for adjusting the space between the optical element G5 and the optical element G6, and the lens barrel 132, and fixed onto the lens barrel 132 by a holding ring 138.

The lens barrel 132 houses the optical elements G1–G6 though the cell members C1–C6. The lens barrel 132 has an airtight structure with the optical element G1 located closest to the object surface side and the optical element G6 located closest to the image surface side, and forms an atmosphere different from the outside atmosphere. Penetrations (not shown) are formed in the cell members C1–C6, and connect the spaces among the optical elements G1 to G6 to each other.

The purging unit 134 includes a supply line 134a for supplying inert gas to the projection optical system 130, and an exhaust line 134b for exhausting inert gas that has been supplied in the projection optical system 130, and replaces an atmosphere in the lens barrel 132 with inert gas, such as helium, nitrogen, and argon. Helium gas has a smaller density than the air, and facilitates a replacement for a channel from a top to a bottom in the lens barrel 132, shown in FIG. 1A.

The surrounding member 140 is provided between the projection optical system 130 and the plate 170 with a gap CS from the plate 170, and surrounds an optical-path space between the projection 130 and the plate 170. The surrounding member 140 includes a holding portion 141 mounted with an optical element 150, which will be described later, keeps airtight the projection optical system 130 in cooperate with the optical element 150.

The surrounding member 140 has inlets 145 for introducing gas supplied from a gas supplier 160, which will be described later, into a space between the projection optical system 130 and the plate 170, which is formed by the surrounding member 140. The inlets 145 are arranged parallel to the scanning direction and opposite to each other.

The surrounding member 140 is fixed detachably onto the projection optical system 130 by bolts 142. The surrounding member 140 and the projection optical system 130 are bonded with each other via a seal 143 to improve the sealing performance at a contact portion between the projection optical system 130 and the surrounding member 140, and to maintain airtight the projection optical system 130 and the surrounding member 140. For example, an O-ring is used as the seal 143 and an O-ring material preferably minimizes degas of oxygen, water, etc.

The optical element 150 is mounted on the holding portion 141, and transmits exposure light from the projection optical system 130. The optical element 150 is bonded around its whole outer periphery to the holding portion 141 using a bonding element 144. Therefore, a space between the projection optical system 130 and the plate 170 formed by the surrounding member 140 is divided into a space S1 between the projection optical system 130 and the optical element 150, and a space S2 between the optical member 150 and the plate 170. This is to prevent the light intensity from lowering when gas emitted from the plate 170's resist etc. enter the inside of the projection optical system 130, and contaminate the optical elements G1–G6.

The gas supplier 160 supplies gas into the space formed by the surrounding member 140 and the optical element 150 in two directions parallel to the scanning direction. This embodiment connects the gas supplier 160 to the inlet 145 via an inlet pipe 162, and supplies inert gas into the space S2 after controlling its pressure, flow and temperature. The inlets 145 of the surrounding member 140 supply inert gas into the space S2 in opposite directions parallel to the scanning direction. The gap CS exhausts supplied inert gas, to efficiently exhaust oxygen, water, etc. remaining in the space S2.

Figure 2:
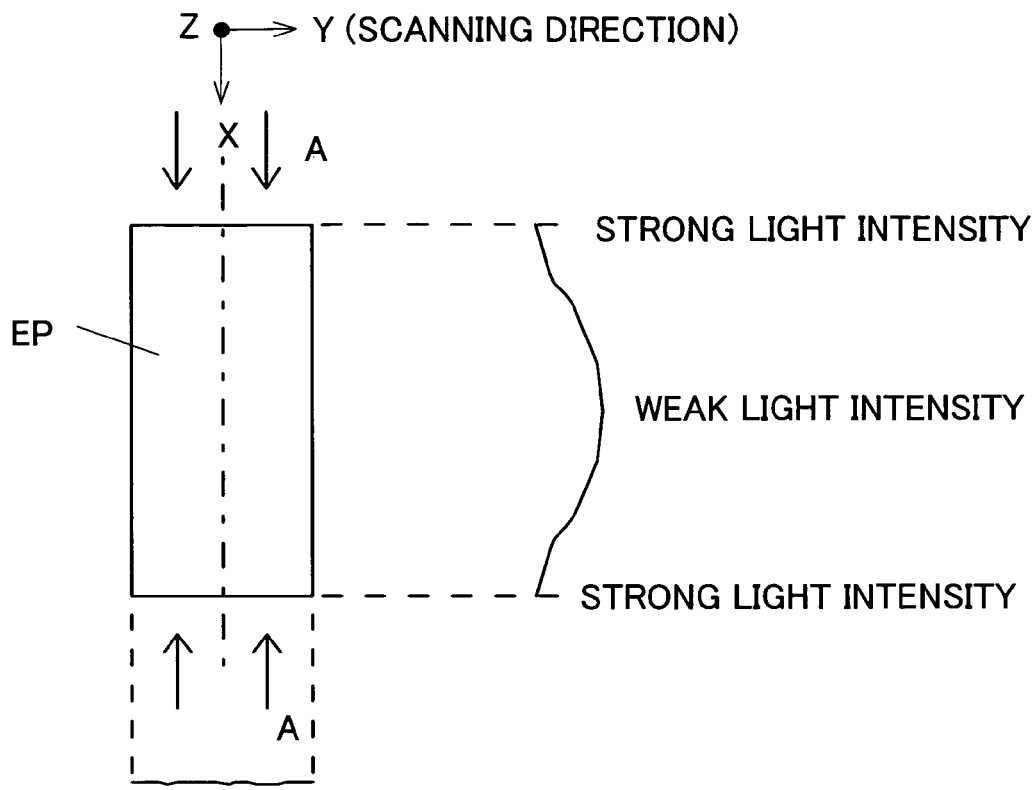
FIG. 2 is a schematic plane view of a supply of inert gas to an exposure area in a longitudinal direction or a direction orthogonal to a scanning direction, and a graph showing uneven light intensity in the exposure area in the scanning direction.
Figure 3:
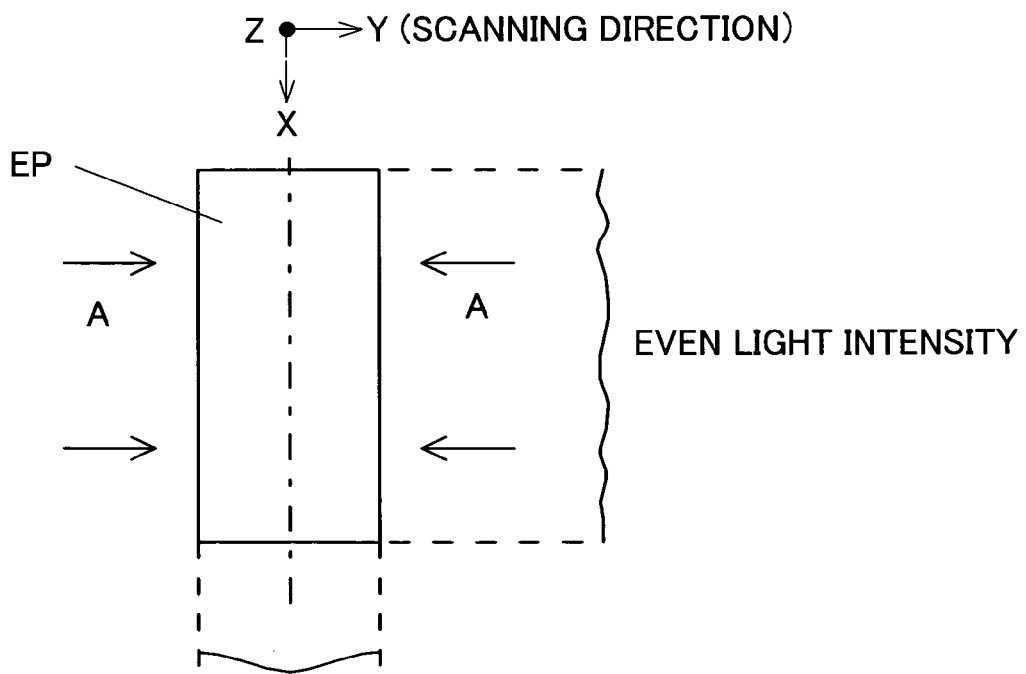
FIG. 3 is a schematic plane view of a supply of inert gas to the exposure area in the scanning direction, and a graph showing approximately even light intensity in the exposure area in the scanning direction.

Referring now to FIGS. 2 and 3, a description will be given of a reason for supplying inert gas in opposite directions parallel to the scanning direction. In FIGS. 2 and 3, the gravity direction is −Z direction, and the scanning direction is ±Y direction. EP is an exposure area in the exposure apparatus 100, and an arrow A is an inert-gas supplying direction.

FIG. 2 is a schematic plane view showing a supply of inert gas to the exposure area EP in a longitudinal direction or a direction orthogonal to a scanning direction, and a graph showing uneven light intensity in the exposure area EP in the scanning direction. The exposure area EP has different concentration distributions of oxygen, water, etc. between a vicinity of an inert-gas supply portion and a center in a longitudinal direction, and exhibits the uneven light intensity. Precise pattern exposure in the scanning direction is unavailable because the exposure area EP cannot maintain appropriate exposure light quantity due to influence of the uneven light intensity.

FIG. 3 is a schematic plane view showing a supply of inert gas to the exposure area EP in the scanning direction, and a graph showing approximately even light intensity in the scanning direction inside of the exposure area. The exposure area EP has a uniform concentration distribution of oxygen, water, etc. between a vicinity of the inert-gas supply portion and the center in a scanning direction, and exhibits the even light intensity. Precise pattern exposure in the scanning direction is available because the exposure area EP can maintain appropriate exposure light quantity. Therefore, a supply of inert gas in two directions parallel to the scanning direction would be able to minimize the influence of the uneven intensity caused by the concentration distributions of oxygen, water, etc., and maintain and improve the throughput.

In FIG. 3, scanning the wafer stage in the +Y direction tends to take in outside gas in the −Y direction. In order to prevent this problem and reduce a gas flow from the outside, an inert-gas amount supplied in the −Y direction is made larger than that supplied in the +Y direction. When the wafer stage is scanned in the −Y direction, the inert-gas supply direction inverts, of course, and the inert-gas supply quantity is adjustable whenever a scanning direction of the wafer stage switches. Since the gas flow from the outside also changes accordingly to a scanning speed of the wafer stage, the inert-gas supply quantity is adjustable according to a scanning speed of the wafer stage.

Supplies of inert gas into the space S2 in opposite directions create an inert-gas flow in the −Z direction as an arrow B in FIG. 1, and allows the insert gas to flow out from the gap CS between the surrounding member 140 and the plate 170, keeping gas etc. emitted from the resist on the plate 170 from approaching to the optical element 150, and minimizing its contaminations. This reduces the exchange frequency of the surrounding member 140 or optical element 150, maintaining the cost reasonable.

The optical element 150 held by the surrounding member 140 or its holding portion 141 is exchanged when contaminated by gas emitted from the resist on the plate 170 etc., preventing degraded light intensity and lowered throughput due to its contaminations.

It takes a long time to exchange the optical element 150 or the surrounding member 140 after the optical element 150 is contaminated by gas emitted from the resist on the plate 170 etc., if the optical element 150 has a large radius of curvature and its centering accuracy etc. affect the optical performance of the exposure apparatus 100 because centering etc. are needed for the optical element 150. Then, it is preferable to form the optical element 150 in a parallel plate shape to eliminate centering etc.

An end surface of the surrounding member 140 has a length L at the side of the plate 170 in a direction orthogonal to the optical axis, and is preferably made longer than a diameter Cb of the gap CS between the surrounding member 140 and the plate 170. This is because the instant inventor has experimentally discovered that the length L larger than the diameter Cb of the gap CS reduce oxygen, water, etc. entering the space S2, and can improve the purge efficiency of the space S2. The improved purge efficiency in the space S2 provides desired exposure light quantity in a short time.

As discussed, the seal 143 located on the contact surface between the projection optical system 130 and the surrounding member 140 also prevents the outside gas including impurities from entering the space S1. More specifically, the improved seal performance of the space S1 reduces deteriorated light intensity, maintains and improves the throughput.

Inert gases supplied to the inside of the projection optical system 130, i.e., the spaces S1 and S2, may differ according to the light performance of the exposure apparatus 100. A mixture of the inert gases supplied to the inside of the projection optical system 130, i.e., the spaces S1 and S2 might change a refractive index of the exposure light and fluctuate the optical performance. Accordingly, a bonding element 144 bonds the holding portion 141 of the surrounding member 140 with the optical element 150, to isolates the space S1 from the space S2 and prevent the mixture of the inert gases.

Turning back to FIG. 1, the plate 170 is an object to be exposed, such as a wafer and a liquid crystal plate, and photoresist is applied to it. A photoresist application step includes a pretreatment, an adhesion accelerator application treatment, a photoresist application treatment, and a pre-bake treatment. The pretreatment includes cleaning, drying, etc. The adhesion accelerator application treatment is a surface reforming process so as to enhance the adhesion between the photo-resist and a base (i.e., a process to increase the hydrophobicity by applying a surface active agent), through a coat or vaporous process using an organic film such as HMDS (Hexamethyl-disilazane). The pre-bake treatment is a baking (or burning) step, softer than that after development, which removes the solvent.

The plate stage 175 supports the plate 170. For example, the plate stage 175 may use a linear motor to move the plate 170 in XYZ directions. The reticle 120 and the plate 170 are, for example, scanned synchronously, so that both are driven at a constant speed ratio. The plate stage 175 is installed on a stage stool supported on the floor and the like, for example, via a damper.

In exposure, the light emitted from the light source section 112, for example, Koehler-illuminates the reticle 120 through the illumination optical system 114. Light that has passed through the reticle 120 and reflects the mask pattern, is reduced at a designated reduction ratio (for example, 1/4 or 1/5), and imaged on the plate 170 by the projection optical system 130. The exposure repeats for transfer areas on the plate 170.

The exposure apparatus 100 can prevent absorptions of the exposure light from lowering the exposure light quantity on the plate 170, and from contaminating the optical elements G1–G6 and the optical element 150, and it can provide devices with high throughput and economic efficiency (such as semiconductor devices, LCD devices, image pick-up devices (such as CCDs), thin film magnetic heads, and the like).

Figure 4A:
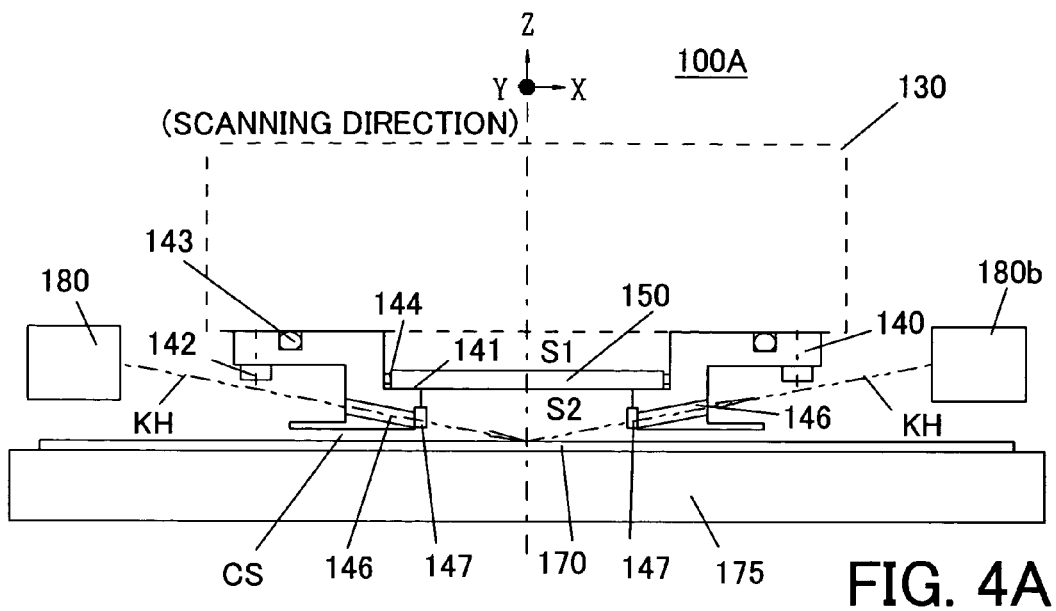
FIG. 4A is a front sectional view and FIG. 4B is a bottom sectional view.
Figure 4B:
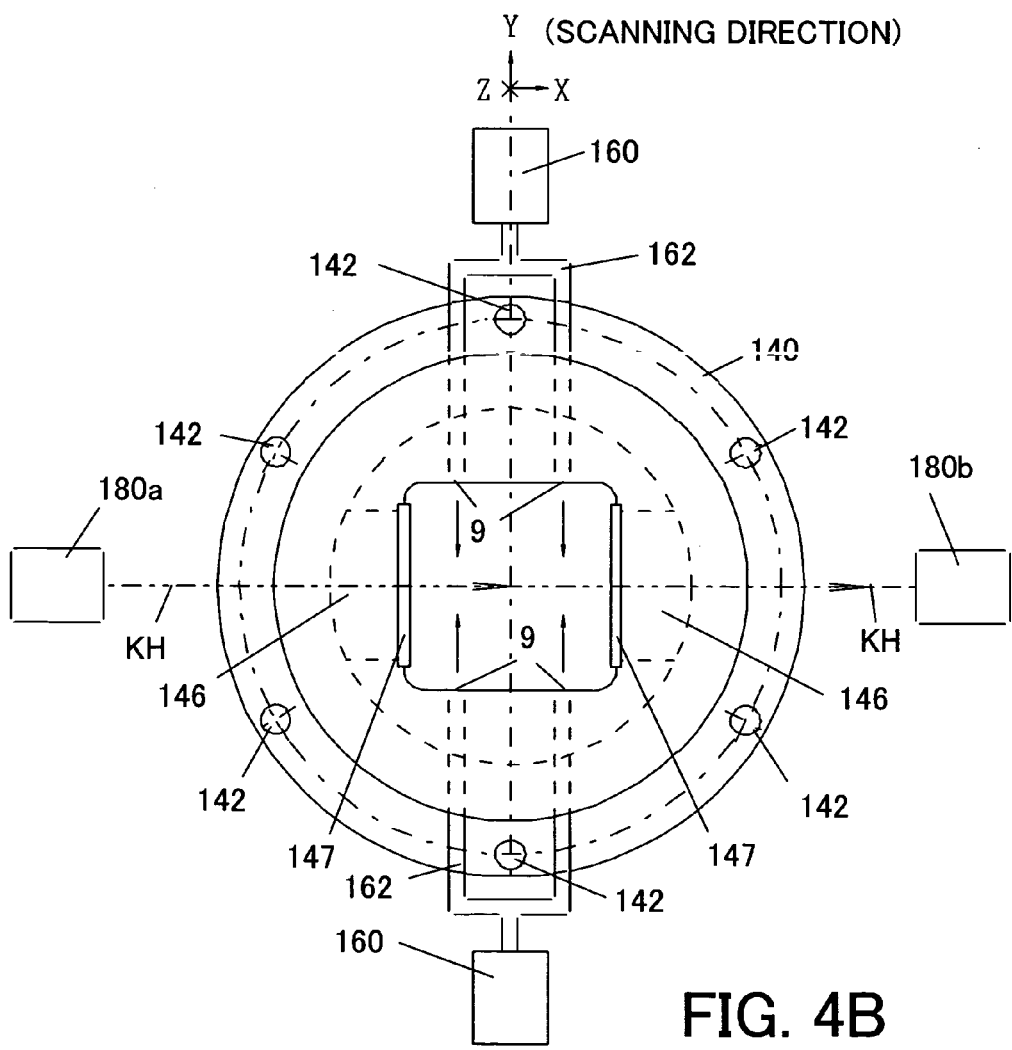

Referring now to FIG. 4, a description will be given of an exposure apparatus 100A as a variation of the exposure apparatus 100 shown in FIG. 1. FIG. 4 is a schematic structure of the exposure apparatus 100A as a variation of the exposure apparatus 100 shown in FIG. 1, wherein FIG. 4A is a front sectional view and FIG. 4B is a bottom section view. FIG. 4 omits the illumination unit 110, the reticle 120, the reticle stage 125, inside structure of the projection optical system 130, and the gas supplier 160, because they are the same as those in the exposure apparatus 100 shown in FIG. 1. The gravity direction is –Z direction, and the scanning direction is ±Y direction.

Referring to FIG. 4, the exposure apparatus 100A is similar to the exposure apparatus 100 shown in FIG. 1, but has a different structure of the surrounding member 140 that includes a position detector 180 to detect a position of the plate 170 by irradiating detection light KH onto the plate 170 oblique to the optical axis. The position detector 180 includes a light emitting portion 180a for emitting the detection light KH, and a light receiving portion 180b for receiving the detection light KH reflected on the plate 170.

The surrounding member 140 has an opening 146 as a passage for the detection light KH emitted from the light emitting portion 180a and the detection light KH reflected on the plate 170 toward the light receiving portion 180b. However, oxygen, water, etc. may enter the space S2 through the opening 146 in the surrounding member 140, and lower the purge efficiency in the space S2. Accordingly, the surrounding member 140 includes a transmission member 147 that transmits the detection light KH and maintains airtight the projection optical system 130 or the space S2.

Pressure and temperature changes in the opening 146 cause detection errors of the position detector 180, deteriorated position adjustment precision of the plate 170, and degraded imaging performance. Therefore, a temperature controller (not shown) provides controls so that a temperature difference between the surrounding member 140 and inert gas around there is below a designated value that does not affect the detection precision of the position detector 180. In addition, as the pressure changes, the optical performance varies. Accordingly, a pressure controller (not shown) controls pressure in the opening 146 to be constant.

Figure 5:
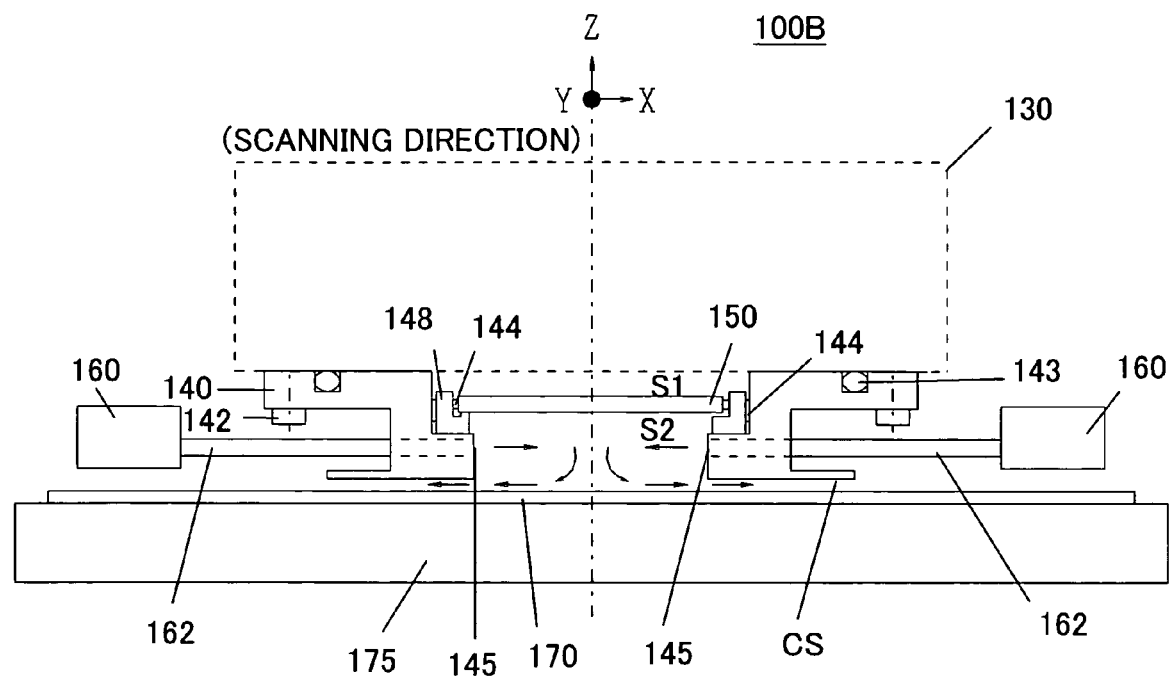
FIG. 5 is a schematic structural view of another variation of the exposure apparatus shown in FIG. 1.
Figure 6:
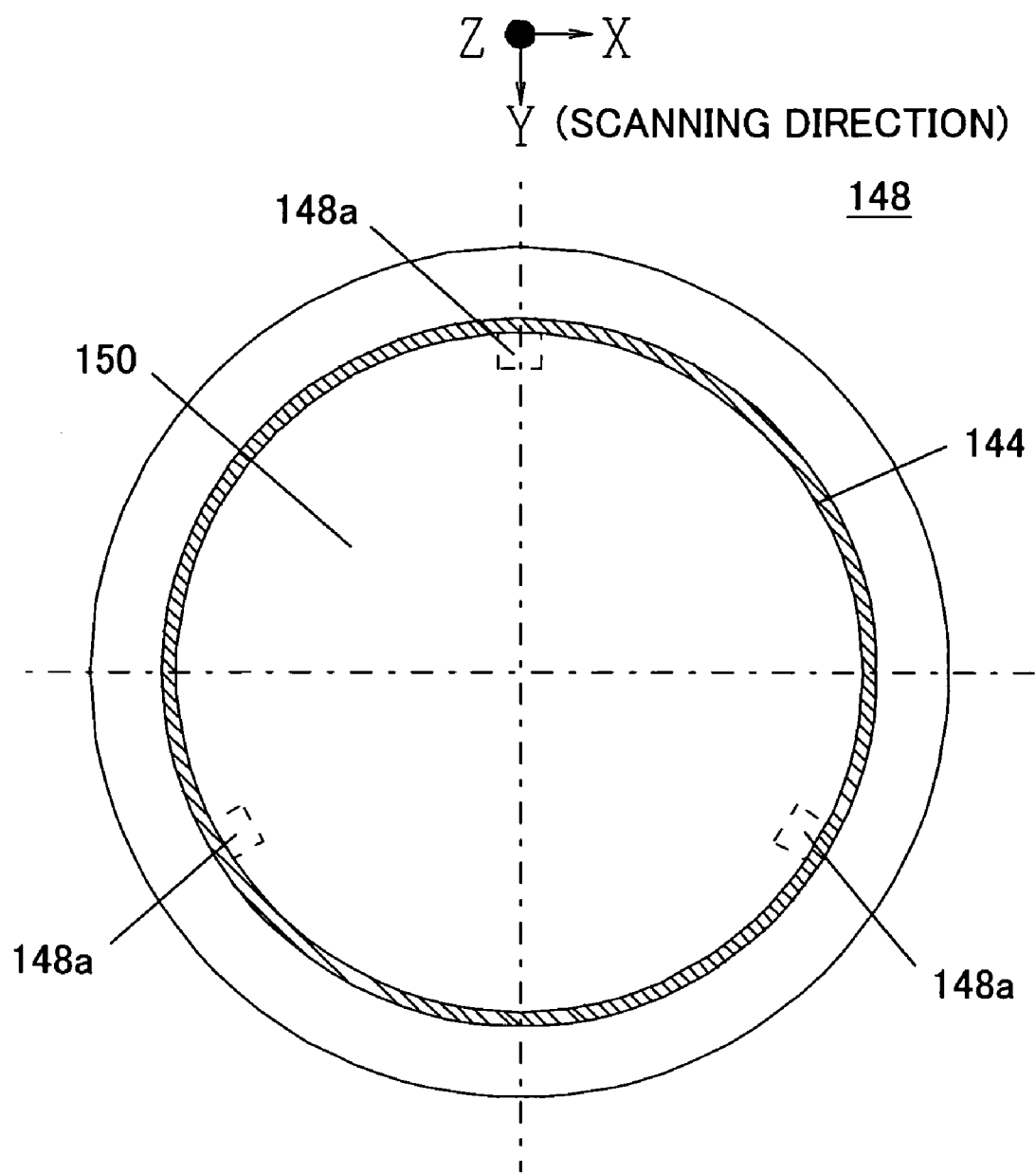
FIG. 6 is a schematic top view of one embodiment of a cell element shown in FIG. 5.

Referring now to FIGS. 5 and 6, a description will be given of an exposure apparatus 100B as a variation of the exposure apparatus 100 shown in FIG. 1. FIG. 5 is a schematic structural view of the exposure apparatus 100B as a variation of the exposure apparatus shown in FIG. 1. FIG. 5 omits the illumination unit 110, the reticle 120, the reticle stage 125, and inside structure of the projection optical system 130, because they are the same as those in the exposure apparatus 100 shown in FIG. 1. The gravity direction is the –Z direction, and the scanning direction is the ±Y direction.

Referring to FIG. 5, the exposure apparatus 100B is similar to the exposure apparatus 100 shown in FIG. 1, but has a different structure of the surrounding member 140. The exposure apparatus 100 uses a holding portion 141 of the surrounding element 140 to hold the optical element 150 around its outer periphery, whereas the exposure apparatus 100B uses a cell element 148 to hold the optical element 150.

Since the surrounding member 140 holds the optical element 150 via the cell element 148, a stress, which is created from the surrounding member 140 when the surrounding member 140 is fixed onto the projection optical system 130 using the bolts 142, is prevented from transmitting to the optical element 150. Therefore, the optical element 150 can minimize deformations to its surface, before and after the surrounding member 140 and the optical element 150 are exchanged, and restrain fluctuations to its optical performance.

The bonding element 144 is preferable used to bond the cell element 148 to the optical element 150 and the cell element 148 to the surrounding member 140 to isolate the space S1 from the space S2. For example, the bonding element 144 uses adhesives etc., which minimize degas of oxygen, water, etc.

FIG. 6 is a schematic top view of one embodiment of the cell element 148 shown in FIG. 5. The cell element 148 supports, shown in FIG. 6, the optical element 150 through supporting portions 148a that are arranged at three points at regular intervals (or at 120° intervals) in a circumferential direction around the optical axis of the optical element 150. The optical element 150 is stable on the supporting portions 148a, and provides predictable surface deformations due to its own weight. The optical performance can thus reduce fluctuations before and after the surrounding member 140 and the optical element 150 are exchanged.

Figure 7:
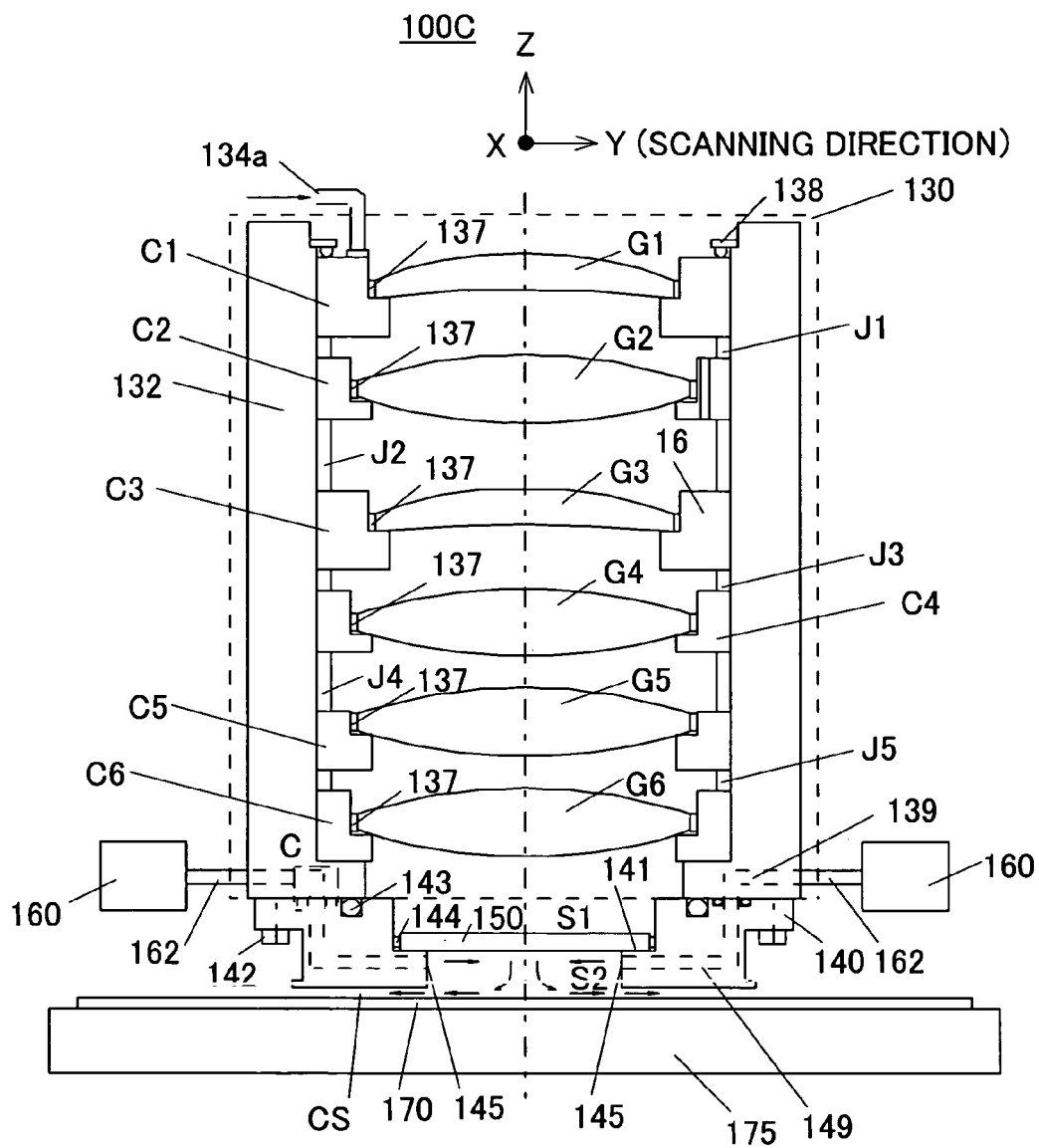
FIG. 7 is a schematic structural view of still another variation of the exposure apparatus shown in FIG. 1.
Figure 8:
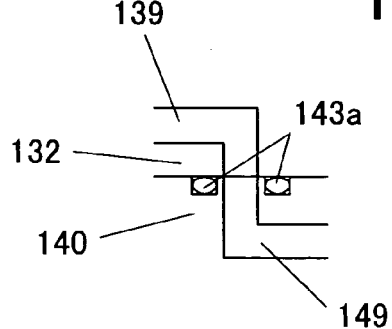
FIG. 8 is a schematically enlarged view of an area C shown in FIG. 7 or a connecting portion between ventilations in a lens barrel and a surrounding member.

Referring now to FIGS. 7 and 8, a description will be given of an exposure apparatus 100C as a variation of the exposure apparatus 100 shown in FIG. 1. FIG. 7 is a schematic structural view of the exposure apparatus 100C as a variation of the exposure apparatus 100 shown in FIG. 1. FIG. 7 omits the illumination unit 110, the reticle 120, and the reticle stage 125, because they are the same as those in the exposure apparatus 100 shown in FIG. 1. The gravity direction is –Z direction, and the scanning direction is ±Y direction.

Referring to FIG. 7, the exposure apparatus 100C is similar to the exposure apparatus 100 shown in FIG. 1, but has a different supply path of inert gas supplied from the gas supplier 160 into the space S2. The exposure apparatus 100 uses the inlet pipe 162 to connect the gas supplier 160 to the surrounding member 140, and supplies the inert gas into the space S2 via inlet 145. On the other hand, the exposure apparatus 100C shown in FIG. 7 uses the inlet pipe 162 to connect the gas supplier 160 to a ventilation 139 formed in the lens barrel 132, connects the ventilation 139 to the ventilation 149 in the surrounding member 140, and supplies inert gas into the space S2 via the ventilations 139 and 149, and the inlet 145. A provision of the supply pipe 162 prevents a limited operating space and a lowered efficiency of exchanges of the surrounding member 140 or the optical element 150.

FIG. 8 is a schematically enlarged view of an area C shown in FIG. 7 or a joint between the ventilations 139 and 149 in the lens barrel 132 and surrounding member 140. Referring to FIG. 8, seals 143a are provided at two points across the ventilations 139 and 149 at the joint between these ventilations 139 and 149 (or a contact surface between the lens barrel 132 and the surrounding member 140). This is to prevent gas leak at the joint between the ventilations 139 and 149, minimizing pressure fluctuations of inert gas supplied into the space S2. For example, an O-ring is used as the seal 143a and the O-ring material preferably minimizes degas of oxygen, water, etc.

Figure 9:
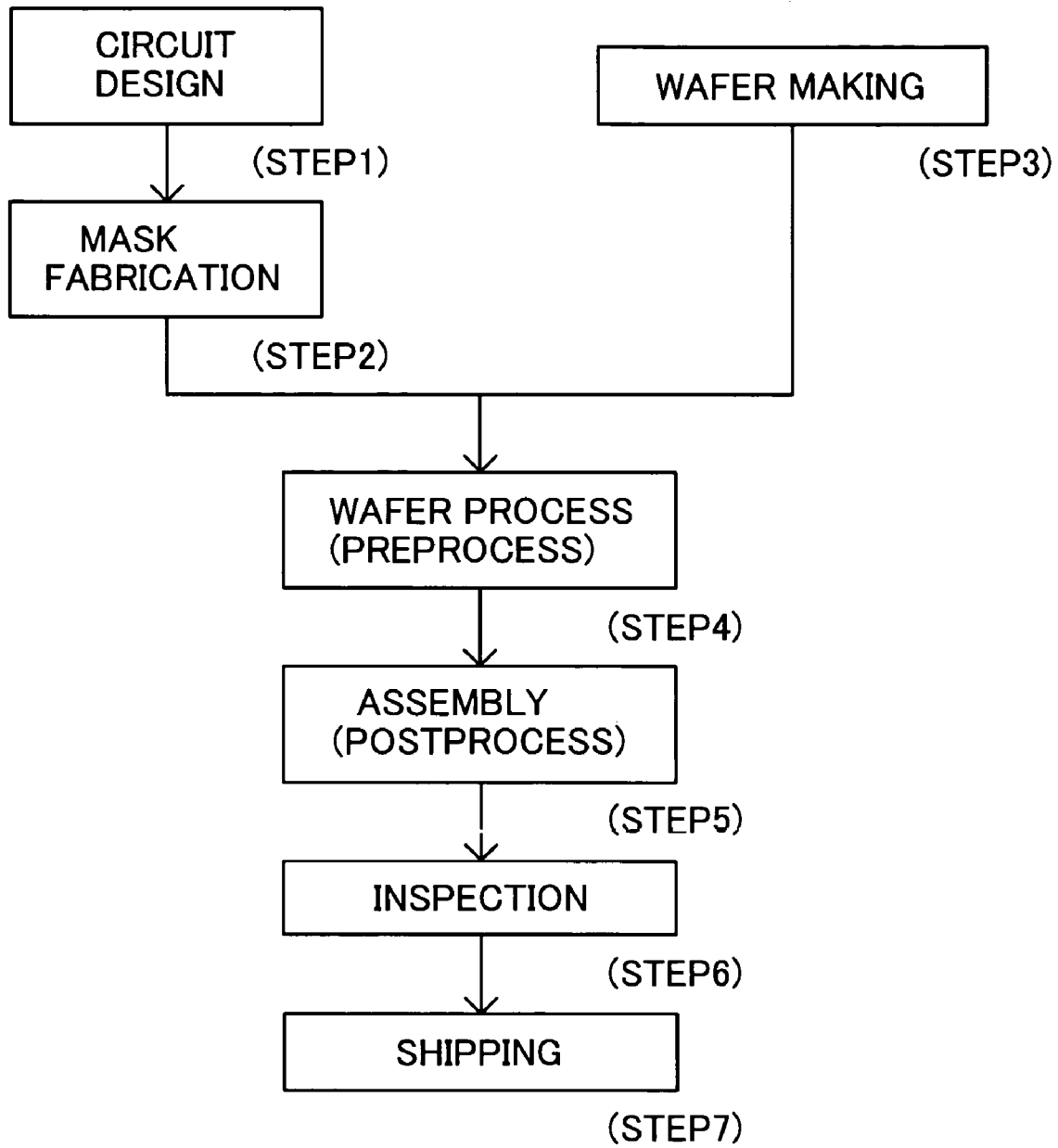
FIG. 9 is a flowchart for explaining a method for fabricating devices (semiconductor chips such as ICs, LSIs, and the like, LCDs, CCDs, etc.).
Figure 10:
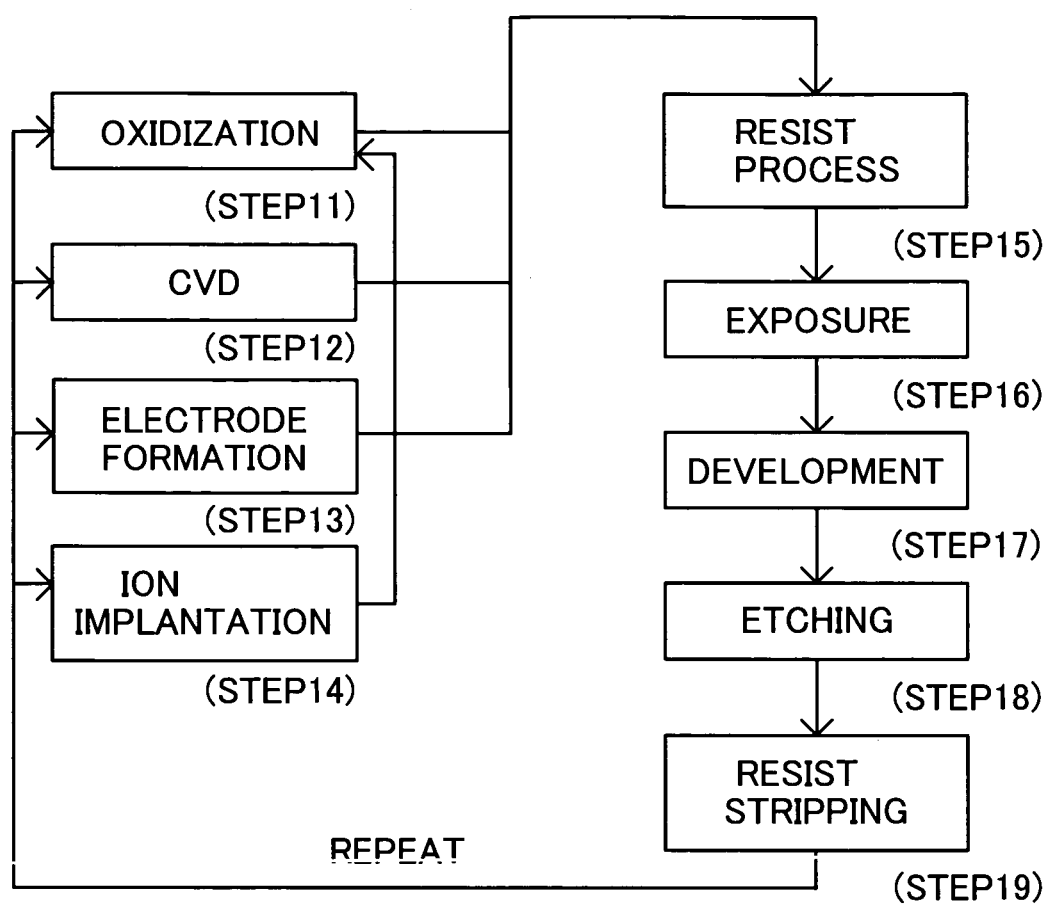
FIG. 10 is a detailed flowchart for Step 4 of wafer process shown in FIG. 9.
Figure 11:
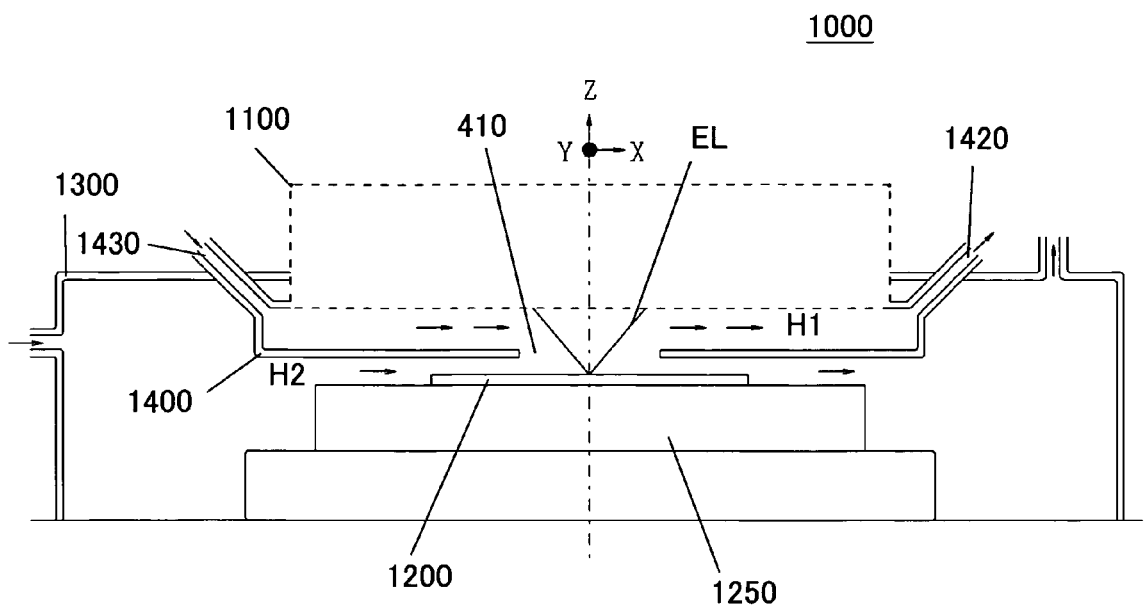
FIG. 11 is a schematic structural view of part of a conventional exposure apparatus.

Referring now to FIGS. 9 and 10, a description will be given of an embodiment of a device fabricating method using the above exposure apparatus 100 (including the exposure apparatus 100A–100C). FIG. 9 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 10 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 100 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one.

Further, the present invention is not limited to these preferred embodiments, and various variations and modifications may be made without departing from the scope of the present invention.

Thus, the present invention can provide an exposure apparatus with excellent throughput and optical performance, which reduces absorptions of exposure light, maintains the exposure light quantity on the object, and prevents contaminations of an optical element.

What is claimed is:

1. An exposure apparatus for exposing an object to a pattern of a reticle, said exposure apparatus comprising:
a scanning portion for scanning the reticle in synchronization with the object;
a projection optical system for projecting the pattern onto the object;
a surrounding member for surrounding a space between the projection optical system and the object; and
a gas supplier for supplying gas to the space in a direction which is substantially parallel to a scanning direction; and
a barrel having a first ventilation to flow the gas supplied by the gas supplier, said barrel accommodates the projection optical system,
wherein the surrounding member is detachably connected to the projection optical system and has a second ventilation to flow the gas supplied by the gas supplier,
wherein said first ventilation and second ventilation are connected, and
wherein said gas supplier supplies gas to the space though the first ventilation and second ventilation.

2. An exposure apparatus according to claim 1, further comprising a seal for maintaining airtight the projection optical system and the surrounding member.

3. An exposure apparatus according to claim 1, wherein the projection optical system includes a parallel plate that contacts the space around the object.

4. An exposure apparatus according to claim 1, further comprising:
a position detector for detecting a position of the object by obliquely irradiating light onto the object; and
a transmission element, provided to the surrounding member, for transmitting light for position detections and for maintaining airtight the space.

5. An exposure apparatus according to claim 1, wherein the gas supplier supplies the gas to the space in two opposite directions parallel to the scanning direction.

6. An exposure apparatus according to claim 5, wherein the gas supplied in the scanning direction of the object is more than the gas supplied in a direction opposite to the scanning direction.

7. An exposure apparatus according to claim 5, further comprising a gas flow controller for controlling a flow of the gas supplied in the scanning direction of the object and/or a direction opposite to the scanning direction in accordance with the scanning direction and/or a scanning speed of the object.

8. An exposure apparatus according to claim 1, wherein the gas supplied by the gas supplier is inert gas.

9. A device fabrication method comprising the steps of:
exposing an object by using an exposure apparatus according to claim 1, and developing the object that has been exposed.

10. An exposure apparatus for exposing a pattern of a reticle onto an object by scanning the reticle and the object, said exposure apparatus comprising:
a projection optical system for projecting the pattern onto the object;
a surrounding member, provided between the projection optical system and the object and spaced from the object, for keeping airtight a space around the object in cooperation with the projection optical system; and
a gas supplier for supplying gas to the space in a direction parallel to a scanning direction and
a barrel having a first ventilation to flow the gas supplied by the gas supplier, said barrel accommodates the projection optical system, wherein the surrounding member is detachably connected to the projection optical system and has a second ventilation to flow the gas supplied by the gas supplier,
wherein said first ventilation and second ventilation are connected, and
wherein said gas supplier supplies gas to the space though the first ventilation and second ventilation.

11. A device fabrication method comprising the steps of:
exposing an object by using an exposure apparatus according to claim 10, and developing the object that has been exposed.

* * * * *

UNITED STATES PATENT AND TRADEMARK OFFICE
CERTIFICATE OF CORRECTION

| | | |
|---|---|---|
| PATENT NO. | : 7,068,352 B2 | Page 1 of 1 |
| APPLICATION NO. | : 10/785803 | |
| DATED | : June 27, 2006 | |
| INVENTOR(S) | : Naoki Irie | |

It is certified that error appears in the above-identified patent and that said Letters Patent is hereby corrected as shown below:

On the Title Page, References Cited, U.S. Patent Documents: Item (56)

Change "6,559,922 B1 5/2003 Hansell et al." to --6,559,922 B2 5/2003 Hansell et al.--;
    Change "6,642,996 B1 11/2003 Nogawa" to --6,642,996 B2 11/2003 Nogawa--;
    Change "6,721,031 B1 4/2004 Hasegawa et al." to --6,721,031 B2 4/2004 Hasegawa et al.--;

In Column 1, Line 1:

Change "though" to --through--;

In Column 13, Line 6:

Change "though", to --through--.

Signed and Sealed this

Twenty-third Day of January, 2007

JON W. DUDAS
*Director of the United States Patent and Trademark Office*